Sept. 22, 1964 H. DYM 3,150,273

BINARY TRIGGER CIRCUIT EMPLOYING TUNNEL DIODE DEVICE

Filed June 28, 1961

INVENTOR
HERBERT DYM

BY [signature]
ATTORNEY 3,150,273
Patented Sept. 22, 1964

3,150,273

BINARY TRIGGER CIRCUIT EMPLOYING TUNNEL DIODE DEVICE

Herbert Dym, Amawalk, N.Y., assignor to International Business Machines Corporation, New York, N.Y., a corporation of New York Filed June 28, 1961, Ser. No. 120,276
8 Claims. (Cl. 307—88.5)

This invention relates to semiconductor trigger circuits and more particularly to a binary trigger circuit employing a device exhibiting a quantum mechanical tunneling phenomenon and a negative resistance characteristic biased for bistable operation, such as a Tunnel diode.

The data processing industry has continually exerted an effort to improve the reliability of individual circuits and yet increase the speed at which data is processed. To this end, the virtues of a device, popularly named the "Esaki" or "Tunnel" diode, the term tunnel referring to a quantum mechanical tunneling phenomenon associated with such a device, has sought to be utilized in different types of logical circuitry. The Tunnel diode as described in an article appearing in the "Physical Review" for January 1957, on pp. 603–604, entitled "New Phenomenon in Narrow Germanium P-N Junction," by Leo Esaki, is a P-N junction device, in which the junction is very thin (on the order of 150 Angstrom units or less) and in which the semiconductor materials on both sides of the junction have high impurity concentrations (on the order of $10^{19}$ net donor or acceptor atoms per cubic centimeter for germanium).

The Tunnel diode is characterized by a very low reverse impedance, approaching a short circuit, with a forward potential current characteristic exhibiting a negative resistance region beginning at a small value of forward potential (on the order of 0.05 volt) and ending at a large forward potential (on the order of 0.2 volt). The potential value at the low potential end of the negative resistance region is very stable with respect to temperature and does not vary over a range of temperatures of a value near 0° K. to several hundred degrees K. For potential values outside the limited range described above, forward resistance of the Tunnel diode is positive. For a further understanding of the structure and operational characteristic of the Tunnel diode, reference is made to an article appearing in the "Proceedings of the IRE", July 1959, pp. 1201–1206, entitled "Tunnel Diodes as High Frequency Devices," by H. S. Sommers, Jr.

Heretofore, it has been shown that the Tunnel diode may be properly biased for bistable operation, the voltage difference between two stable states being employed to control operation of a device or load utilized in conjunction with the Tunnel diode. Loads which exhibit linear characteristics designed to achieve maximum current gain cause operation of the Tunnel diode in its first region of positive resistance and the region of positive resistance beyond the negative resistance slope. It has been found that by applying the combination of a Tunnel diode coupled to a load which exhibits a substantially open circuit characteristic, such as a transistor, a greater voltage swing between the two operating stable states of the Tunnel diode is provided to allow control of devices heretofore considered inapplicable for use therewith. This latter technique is disclosed and claimed in copending application Serial Number 7,414, filed on February 8, 1960, on behalf of Gordon W. Neff et al. and assigned to the assignee of this application, wherein the combination of a Tunnel diode and transistor is employed to provide a latch circuit which in combination may be utilized with other similar circuitry to construct a binary trigger circuit. While this previous binary trigger circuit is capable of responding to high speeds of information bit inputs, a large amount of components is required and a reduction of these components is desirable from a unit cost standpoint.

The circuit is constructed by connecting a device, such as a Tunnel diode, which exhibits a quantum mechanical tunneling phenomenon and a negative resistance output characteristic to a switching element, such as a transistor, exhibiting conductive and nonconductive opearting states. The device is biased for bistable operation and connected to the switching element such that the operating state of the switching element is dependently related to the stable state of the device. Thus, as described in the cited copending application Serial Number 7,414, when the device is in a low voltage stable state, the switching element, i.e. transistor, is in a nonconductive state; the switching element is operated in a conductive state when the device assumes a high voltage stable state. Further, the switching element is connected back to the device in a feedback relationship to provide a negative feedback current path, and the input pulses to the circuit are controlled to be of a predetermined magnitude and duration. The magnitude of a input pulse is controlled to cause switching of the device from the low voltage stable state to the high voltage stable state during its positive excursion, but is insufficient to cause switching of the device from the high voltage state to the low voltage state during its negative excursion. The duration of each input pulse is dependent upon a time delay response characteristic usually exhibited by switching elements such as transistors. With the device operating in the high voltage stable state and the switching element conductive, an input pulse applied to the circuit causes the device to conduct more heavily and thereby further bias the switching element for heavier conduction. Due to the time delay response characteristic of the switching element, the input pulse is gone by the time the switching element responds, causing negative feedback to the device which switches the device to the low voltage stable state, which in turn, switches the switching element to its nonconductive state. In order to insure the proper switching of the device to the low voltage state, the input pulse duration is controlled to be less than the time delay response characteristic of the switching element.

Accordingly, it is a prime object of this invention to provide an improved binary trigger circuit.

Another object of this invention is to provide an improved binary trigger circuit employing high speed semiconductor switching elements.

Still another object of this invention is to provide an improved binary trigger circuit employing a Tunnel diode transistor latch combination with feedback.

Yet another object of this invention is to provide a high speed Tunnel diode transistor latch combination for a binary trigger circuit requiring a minimal number of components.

Another object of this invention is to provide an improved high speed binary trigger circuit employing solid state components in combination wherein one component exhibits a quantum mechanical tunneling phenomenon and a negative resistance output characteristic while another exhibits different conductive states with a response delay characteristic employed in causing negative feedback in controlling the operation of the circuit.

The foregoing and other objects, features and advantages of the invention will be apparent from the following more particular description of a preferred embodiment of the invention, as illustrated in the accompanying drawings.

Figure 1:
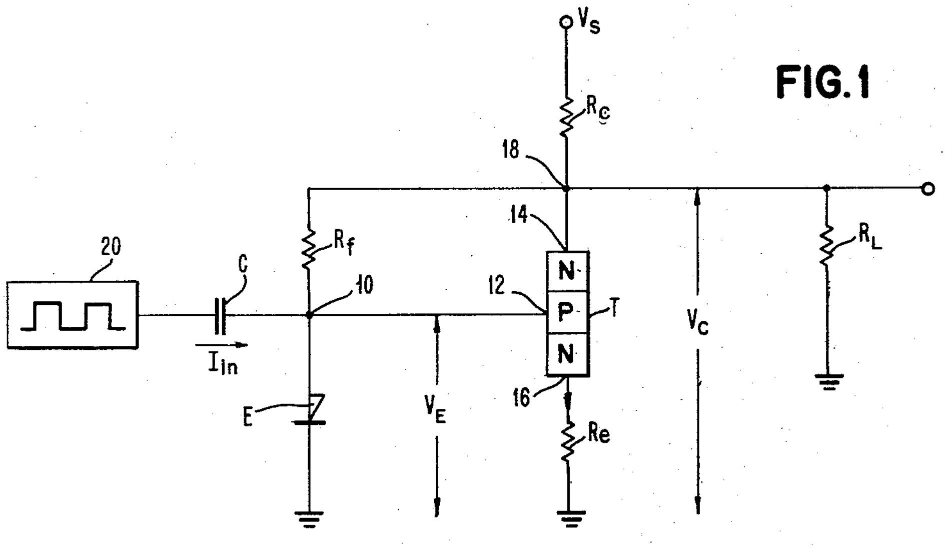
FIG. 1 is a schematic illustration of an embodiment of this invention.

Referring to FIG. 1, a Tunnel diode E is shown having one end connected to ground and the other end connected at a terminal 10 to a base electrode 12 of an NPN transistor T having a collector electrode 14 and an emitter electrode 16. The collector electrode 14 of transistor T is connected to a voltage source $V_s$ through a terminal 18 and collector resistance $R_c$; the terminal 18 is connected to the terminal 10 through a resistor $R_f$ to provide a feedback to the diode E. The emitter electrode 16 is connected to ground through a resistance $R_e$. Terminal 18 is connected to a load $R_L$ and terminal 10 is connected to an information input signal source 20 through a capacitor C.

Figure 3:
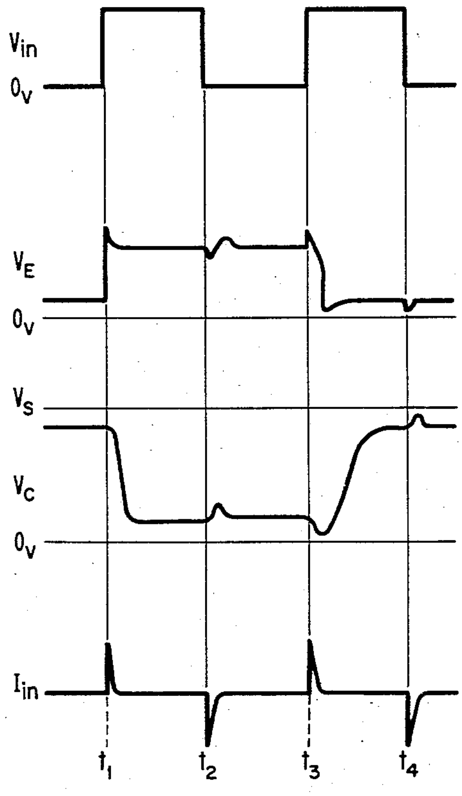
FIG. 3 is an illustration of the input and output wave forms obtained in operation of the embodiment of FIG. 1.
Figure 2:
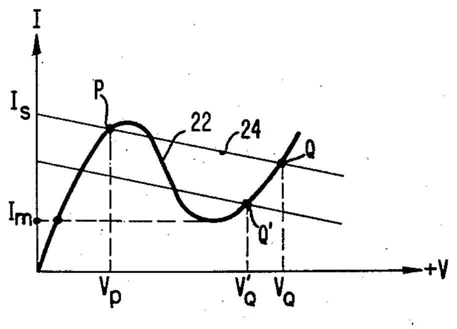
FIG. 2 is an output characteristic of a Tunnel diode as operated in the circuit of FIG. 1.

In order to clearly comprehend the operation of the circuit of FIG. 1, reference will be made to the characteristic of the diode E as shown in FIG. 2 and the waveforms obtained at various points in the circuit of FIG. 1 as shown in the FIG. 3. The Tunnel diode E of FIG. 1 exhibits a current (I) versus potential (V) output characteristic shown in FIG. 2 by a curve 22. The curve 22 describes a first region of positive resistance over a low range of potentials continuous at a peak value with a second region of negative resistance, and thence a third region of positive resistance. A current $I_s$ is provided to the diode E by source $V_s$ providing a load line 24 which intersects the characteristic curve 22 at a point P, at voltage $V_P$, in the first region of the diode characteristic and at a point Q, at voltage $V_Q$, in the third region of the diode characteristic.

A complete cycle of operation of the circuit of FIG. 1 will subsequently be described in detail with reference to FIG. 2 and FIG. 3, where FIG. 3 describes voltages obtained at various points in the circuit of FIG. 1 during operation thereof. In a normally operating state, previous to a time $t_1$, the transistor T is in a non-conductive state and the source $V_s$ supplies a current through $R_c$ to terminal 18. A very small current is passed through transistor T since it is not conductive while most of the current through $R_c$ will pass through $R_f$ and diode E. There is a drop of potential across $R_c$ and the voltage at the collector 14 of transistor T, $V_c$, is not equal to the supply voltage, $V_s$. Further, most of the voltage drop from terminal 18 to ground is absorbed across $R_f$ and only a small voltage drop, $V_E$, takes place across the diode E.

At the time $t_1$, a positive voltage impulse, $V_{in}$, is applied to the circuit from input source 20. The positive rise of voltage at time $t_1$ causes a positive current impulse $I_{in}$, due to the small value of capacitor C, which current impulse is of small duration. This current input $I_{in}$ is practically all shunted through the diode E since transistor T is not conductive. The input current through diode E is of sufficient magnitude to move the operating point of the diode E from point P above the peak current value and switch the diode E to operation in its third region as shown in FIG. 2. The diode E is then established at operating state Q on curve 22 of FIG. 2. This change in voltage across diode E, $V_E$, from $V_P$ to $V_Q$, is applied to the base electrode 12 of transistor T causing the transistor T to conduct thus lowering the voltage $V_c$. The transistor T is kept from operating in saturation by resistor $R_e$ and the reason therefor will be explained subsequently. Conduction of transistor T shunts more current away from terminal 18 through T and $R_e$ to ground causing operation of the diode E to be established in a stable operating state Q', at voltage $V_Q'$.

Operation of the diode E at stable state Q' is controlled by the circuit parameters so that the magnitude of current value from operating state P to the peak current value of the diode E, as is shown in FIG. 2, is less than the magnitude of current from point Q' to a minimum valley current $I_m$ for the diode E. This control is required, since, at a time $t_2$, the voltage input $V_{in}$ goes negative causing a negative current impulse $I_{in}$ of a magnitude similar to that provided at time $t_1$, which moves operation of the diode E toward the minimum valley current value $I_m$ but is insufficient to cause switching back to the first positive resistance region. Further, all the current input at time $t_2$ is not shunted through the diode E, but a portion of this current is also directed through the now conducting transistor T which also insures that the diode E will not be switched. The small current from the input $I_{in}$ which flows through transistor T at time $t_2$ reduces the amount of conduction of transistor T thereby raising the collector voltage, $V_c$, slightly. However, the slight rise in voltage $V_c$ is delayed and raises the diode voltage $V_e$ slightly with a small overshoot.

At a time $t_3$, another input pulse, $V_{in}$, is directed to the circuit from source 20, causing a positive current impulse $I_{in}$ to be directed to terminal 10. Instantaneously, the current through the diode E increases to provide a greater voltage drop $V_E$ across diode E. This increase of voltage is applied to the base 12 of transistor T. Due to the inherent response delay characteristic of transistor T, as the input current impulse $I_{in}$ dies down, the transistor T continues to conduct more heavily since $R_e$ allows a further decrease in collector voltage $V_c$. The transistor T then conducts more current, shunting a greater portion of the current supplied by $V_s$ through $R_c$ away from terminal 18, causing a decrease of current through diode E below the magnitude $I_m$. The diode E is then switched back to operation in the first positive resistance region of its characteristic curve 22. Switching of the diode E provides a voltage change to the base 12 of transistor T causing the transistor T to be cut-off. The voltage at the collector 14 of transistor T, $V_c$, then rises and the diode E is established in the P operating stable state and transistor T is established in the nonconductive operating state. It should be here noted, that the delayed reaction which occurs at the collector 14 of transistor T after $I_{in}$ has passed is the operation which causes switching of diode E. Therefore, the input current pulse $I_{in}$ is preferably controlled to be of a shorter time duration than the inherent response delay of the transistor T.

At a time $t_4$, when the input voltage $V_{in}$ goes negative, a negative current pulse $I_{in}$ is directed to terminal 10. This current is shunted through the diode E causing operation of the diode to move from point P to the left in the first positive resistance region for operation at a lower curent and a lower operating voltage. Delayed operation of transistor T causes the voltage $V_c$ to rise slightly until after passage of the input current pulse $I_{in}$.

In the interest of providing a complete disclosure, details of one embodiment of the circuit of FIG. 1 are given below, however, it is to be understood that other component values and current magnitudes may be employed with satisfactory operation attained so that the values given should not be considered limiting.

In the embodiment of FIG. 1, with the source $V_s$ supplying 11 volts, the resistor $R_c$ has a value of 3.9K ohms, the resistor $R_f$ a valve of 8.2K ohms, the resistor $R_e$ a value of 48 ohms, with the transistor T being a germanium transistor having an alpha cut-off ($\alpha$) in the range of 5 megacycles. Further, the diode E may be a germanium Tunnel diode having an approximate peak current value of 1.0 milliampere and a minimum or valley current of 0.3 milliampere with the capacitor C having a value of 100 micro-microfarads.

With the circuit of FIG. 1 constructed as set forth above, the input signal pulses may have a magnitude of 1.2 volts, a duration of approximately 100 microseconds with a rise time of approximately 10 millimicroseconds.

While the invention has been particularly shown and described with reference to a preferred embodiment, it will be understood by those skilled in the art that changes in form and details may be made therein without departing from the spirit and scope of the invention.

What is claimed is:

1. In a binary trigger circuit, the combination of a device exhibiting a quantum mechanical tunneling phenomenon and a negative resistance output characteristic biased for bistable operation, a switching element exhibiting conductive and nonconductive operating states and a delay response characteristic, first means intercoupling said switching element and said device for dependently relating the operating state of said switching element to the stable state of said device, second means connecting said switching element back to said device in a feedback relationship for prelating the stable state of said device to the operating state of said switching element, and input means connected to said first means for applying successive impulses of similar polarity and magnitude to said device and to said switching element, said impulses being of shorter time duration then the delay response characteristic of said switching element whereby said device is alternately switched from one stable state to another.

2. In a binary trigger circuit, the combination of a semiconductor device exhibiting a quantum mechanical tunneling phenomenon and a negative resistance output characteristic biased for bistable operation, a semiconductor switching element exhibiting conductive and nonconductive states and a delay response characteristic, first means interconnecting said device and said switching element for dependently relating the state of said switching element to the stable state of said device, second means connecting said switching element back to said device in a feedback circuit loop for relating the stable state of said device to the operating state of said switching element, and input means connected to said first means for applying successive impulses of similar polarity and magnitude to said device and to said switching element, said impulses being of a shorter time duration than the delay response characteristic of said switching element whereby said device is alternately switched from one stable state to another.

3. In a binary trigger circuit, the combination of a semiconductor device exhibiting a quantum mechanical tunneling phenomenon and a negative resistance output characterisitc biased for bistable operation; a transistor having base, collector and emitter electrodes exhibiting conductive and nonconductive states and a delay response output characteristic, first means connecting the base and emitter electrodes of said transistor to said device for dependently relating the state of said transistor to the stable state of said device, second means connecting the collector of said transistor to said device to form a negative feedback loop for relating the stable state of said device to the operating state of said switching element, and input means for applying successive impulses of similar polarity and magnitude to said device and to said transistor, said impulses being of a time duration less than the delay response characteristic of said transistor whereby said device is alternately switched from one stable state to another.

4. In a binary trigger circuit, the combination of a semiconductor device having a first and second electrode exhibiting a quantum mechanical tunneling phenomenon and a negative resistance characteristic biased for bistable operation; a transistor having a base, a collector and an emitter electrode exhibiting a nonconductive state and a conductive state with a delay response output characteristic, first circuit means connecting the first and second electrodes of said device to the base and emitter electrodes of said transistor, respectively, for dependently relating the state of said transistor to the stable state of said device, second circuit means connecting the collector electrode of said transistor back to the first electrode of said device to form a negative feedback circuit loop for relating the stable state of said device to the operating state of said switching element, and input means for applying successive impulses of similar polarity and magnitude to said first circuit means, said impulses having a time duration less than the delay response characteristic of said transistor for alternately switching said device from one stable state to another.

5. In a binary trigger circuit the combination of a two terminal tunnel diode biased for bistable operation; an NPN transistor having base, collector and emitter electrodes; said transistor exhibiting nonconductive and conductive operating states with a delay response output characteristic, first circuit means connecting the two terminals of said diode to the base and emitter electrodes of said transistor for dependently relating the operating state of said transistor to the stable state of said diode, second circuit means connecting the collector electrode back to one of the two terminals of said diode to form a negative feedback circuit for relating the stable state of said device to the operating state of said switching element, and input means for applying successive impulses of similar polarity and magnitude to said first circuit means, said impulses having a time duration less than the delay response characteristic of said transistor for alternately switching said tunnel diode from one stable state to another.

6. In a binary trigger circuit, the combination of a tunnel diode biased for bistable operation, an electronic switching element exhibiting non-conductive and conductive operating states with a delay response output characteristic, first means interconnecting said diode and said element for dependently relating the operating state of said switching element to the stable state of said diode, second means connecting said switching element back to said diode to form a negative feedback circuit loop for relating the stable state of said device to the operating state of said switching element, and input means connected to said first means for applying successive impulses of similar polarity and magnitude to said diode and to said switching element, said impulses having a time duration less than the relay response characteristic of said element whereby said diode is alternately switched from one stable state to another.

7. In a binary trigger circuit, the combination of a two terminal semiconductor device exhibiting a negative resistance characteristic and adapted for bistable operation, a transistor element exhibiting a delay response characteristic and including base, collector, and emitter electrodes, means for connecting said semiconductor device across the emitter-base junction of said transistor element so as to dependently relate to the operation of said transistor with the operation of said semiconductor device, and feedback means connecting said collector electrode of said transistor element to said semiconductor device whereby current through said semiconductor device is determined by the operation of said transistor element, and means for successively supplying a first and a second pulse of predetermined polarity and of time duration less than the delay response characteristic of said transistor element in time sequence to said semiconductor device and concurrently along said connecting means to said transistor element, said first pulse being effective to switch said semiconductor device from a first stable state to a second stable state, said transistor element being responsive to said second pulse and while said semiconductor device is in said second state to control said feedback means to switch said device from said second voltage state to said first voltage state.

8. In a binary trigger circuit, the combination of a semiconductor device adapted for bistable operation and exhibiting negative resistance characteristics which define a peak current and a valley current, circuit means having an input and an output terminal and exhibiting a delay response characteristic, means for connecting said device and said input means to dependently relate the operation of said device and said circuit means, said connecting means including a feedback loop connecting said output terminal of said circuit means to said device, and means for successively applying a first and a second pulse of predetermined polarity along said connecting means, said first pulse being effective to increase current along said device in excess of said peak current whereby said device is switched to a first stable state, said element being responsive to said second pulse while said device is operative in said first stable state such that current along said feedback loop and through said device is reduced below said valley current to switch said device to a second stable state, said pulses having a duration less than the delay response characteristics of said circuit means.

References Cited in the file of this patent

UNITED STATES PATENTS

| | | |
|---|---|---|
| 3,040,190 | Buelow | June 19, 1962 |
| 3,102,209 | Pressman | Aug. 27, 1963 |

OTHER REFERENCES

"Utilizing Esaki Diode Latches" (Akmenkalns), in vol. 3, No. 8 of IBM Technical Disclosure Bulletin, dated January 1961.

UNITED STATES PATENT OFFICE
CERTIFICATE OF CORRECTION

Patent No. 3,150,273 September 22, 1964

Herbert Dym

It is hereby certified that error appears in the above numbered patent requiring correction and that the said Letters Patent should read as corrected below.

Column 1, line 25, for "Junction" read -- Junctions --; column 2, line 9, for "opearting" read -- operating --; column 3, line 13, after "feedback" insert -- path --; column 5, line 15, for "prelating" read -- relating --; line 46, for "characterisitc" read -- characteristic --; column 6, line 29, for "non-conductive" read -- nonconductive --.

Signed and sealed this 14th day of September 1965.

(SEAL)
Attest:

ERNEST W. SWIDER
Attesting Officer

EDWARD J. BRENNER
Commissioner of Patents